United States Patent [19]

Wood

[10] Patent No.: US 6,658,120 B2
[45] Date of Patent: Dec. 2, 2003

(54) POLARITY-INDEPENDENT TRANSMISSION SYSTEM

(76) Inventor: James B. Wood, 876 Ethelinda Way, Brea, CA (US) 92821

( * ) Notice: Subject to any disclaimer, the term of this patent is extended or adjusted under 35 U.S.C. 154(b) by 138 days.

(21) Appl. No.: 10/040,136

(22) Filed: Jan. 8, 2002

(65) Prior Publication Data

US 2003/0128852 A1 Jul. 10, 2003

(51) Int. Cl.[7] .............................................. H03G 3/00
(52) U.S. Cl. .......................... 381/104; 381/107; 381/77
(58) Field of Search ................................. 381/104, 106, 381/107, 77, 80, 98, 101, 102, 103

(56) References Cited

U.S. PATENT DOCUMENTS

| | | |
|---|---|---|
| 5,463,695 A | 10/1995 | Werrbach |
| 5,892,834 A | 4/1999 | Smart et al. |
| 6,107,879 A | 8/2000 | Hoshino et al. |
| 6,205,225 B1 | 3/2001 | Orban |

Primary Examiner—Minsun Oh Harvey
(74) Attorney, Agent, or Firm—Robert T. Spaulding

(57) ABSTRACT

A generally asymptotic incoming audio signal is split into positive and negative components. Two separate polarity-independent variable-gain amplifiers act upon the positive and negative components of the signal. A positive (negative) peak rectifier circuit monitors the positive (negative) output component of the signal. Each rectifier has a comparator amplifier that generates an error voltage. The error voltages assign gain factors to the positive (negative) variable gain amplifiers, thereby ensuring that the peak amplitudes of the positive (negative) are the same. A combining amplifier sums the positive (negative) components of the signal to form an amplitude symmetric signal. This signal may be used to modulate a radio frequency carrier to its maximum potential regardless of input signal waveform asymmetry.

3 Claims, 2 Drawing Sheets

POLARITY-INDEPENDENT TRANSMISSION SYSTEM

BACKGROUND OF THE INVENTION

1) Field of the Invention

This invention relates generally to audio processors that incorporate limiting and compression techniques and more specifically to a transmission system including an audio processor that separates the positive and negative portions of an audio information signal and then re-combines the two portions in a manner that optimizes the content of the signal. The optimized information signal is then incorporated within a carrier signal to complete the transmission system.

2) Description of the Prior Art

U.S. Pat. No. 6,205,225 discloses a device in which the input signal is multiplied by a control signal. U.S. Pat. No. 6,107,879 shows an automatic dynamic range control circuit such that, when an excessively high input signal level is fed, the first circuit means can be switched to the second circuit means without distorting the output waveform. U.S. Pat. No. 5,892,834 teaches a device that compresses the dynamic range of an output audio signal. U.S. Pat. No. 5,463,695 shows a compressor whereby a control output signal changes the gain of an amplifier circuit in response to the transient peaks in the sample distorting the output waveform.

None of the above listed patents describe a polarity-independent transmission system whereby the positive and negative portions of a generally asymmetric audio information signal are separated and then optimally combined to modulate a radio frequency carrier.

Accordingly, one object and advantage of the present invention is that an asymmetric audio information signal can be separated into positive and negative components.

Another object and advantage is that the positive and negative components of the information signal may be independently acted upon by polarity-independent variable gain stages.

Another object and advantage is that the separate signals are combined to form an amplitude limited signal that will modulate a radio frequency carrier to its maximum potential regardless of input waveform asymmetry.

Further objects and advantages of this invention will become apparent from consideration of the drawings and ensuing description.

SUMMARY OF THE INVENTION

The present invention is composed of a polarity-independent transmission system that splits a generally asymptotic incoming signal into positive and negative components; each referenced to the input signal baseline. Two separate polarity-independent variable-gain amplifiers act upon the positive and negative components of the signal. A positive peak rectifier circuit permutes the positive output component of the signal and a negative peak rectifier permutes the negative output component. Each rectifier has an associated comparator amplifier that generates an error voltage that represents the difference between the signal peak level and a maximum permitted level established by fixed references. The filtered error voltages assign separate gain factors to the positive and negative waveform excursions operated on by the two polarity-independent variable-gain amplifiers. Each amplifier independently applies the gain necessary to ensure that the peak amplitudes of the positive waveform excursions and the peak amplitudes of the negative waveforms are the same, referenced to the input signal baseline. A combining amplifier sums both the independently limited positive and negative components of the signal to form an amplitude de-limited signal that is symmetrical about the referenced baseline. This signal may be used to modulate a radio frequency carrier to its maximum potential regardless of input signal waveform asymmetry.

Figure 1:
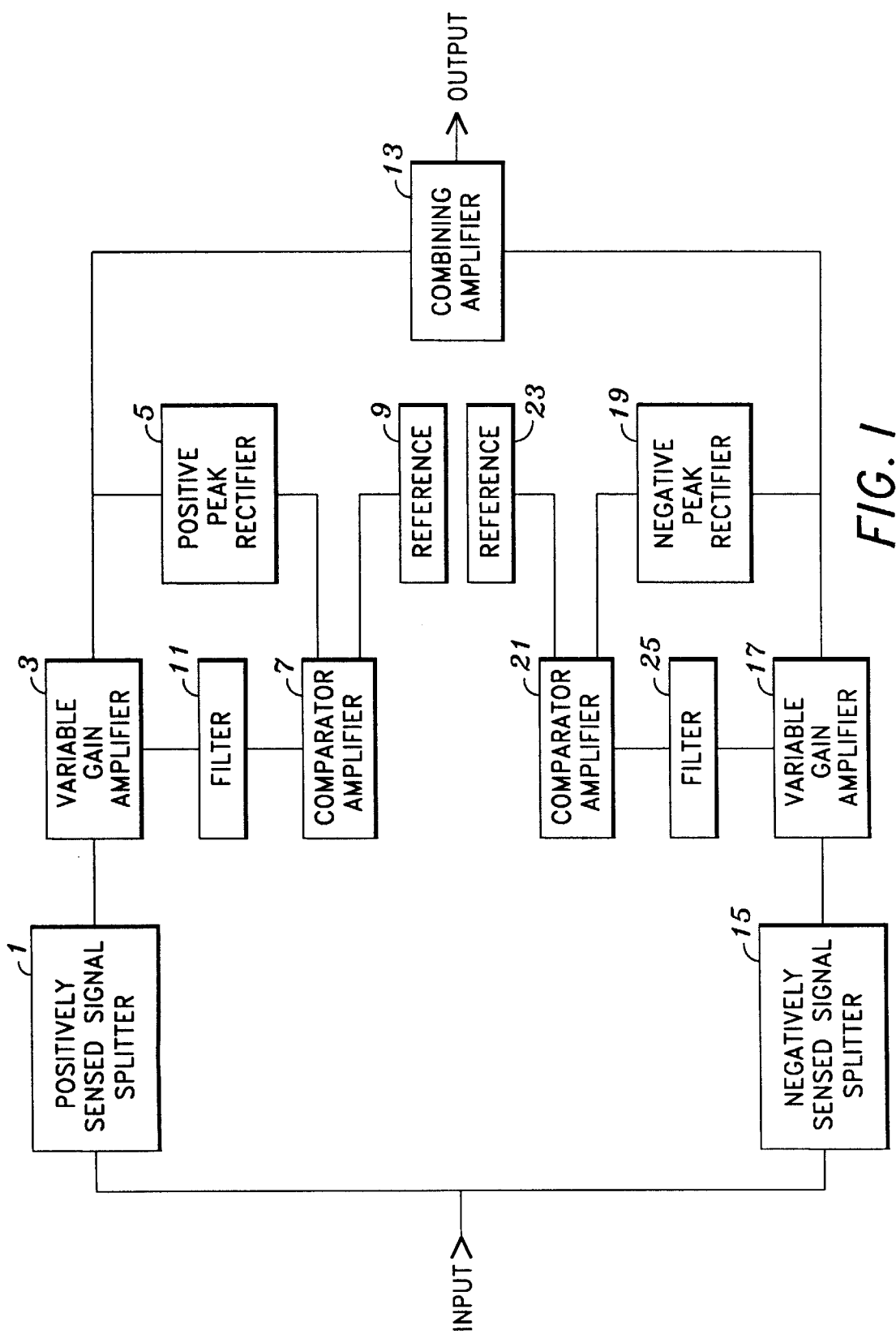
FIG. 1 shows a block diagram of the Polarity-Independent Transmission System in which an input signal is directed to a positively sensed signal splitter 1 and a negatively sensed signal splitter 15. The positively sensed signal passes through a variable gain amplifier 3 where a positive peak rectifier 5 permutes it. The output of the positive peak rectifier forms one input for a comparator amplifier 7. A reference 9 forms another input to the comparator amplifier. The output of the comparator amplifier 7 passes through a filter 11 and forms an error voltage that permutes the gain of amplifier 3. Concurrently, the negatively sensed signal is passing through a variable gain amplifier 17 where a negative peak rectifier 19 permutes it. The output of the negative peak rectifier forms one input for a comparator amplifier 21. A reference 23 forms another input to the comparator amplifier. The output of the comparator amplifier 21 passes through a filter 25 and forms an error voltage that permutes the gain of amplifier 17. The outputs of the monitored variable-gain amplifiers 3 and 17 form the inputs for combining amplifier 13 that processes the signal to form an output used to modulate a radio frequency carrier to its maximum potential regardless of the input waveform asymmetry.

Concurrently, the negatively sensed signal splitter 41 comprises an operational amplifier including suitably placed diodes that allow only negative components of the input signal to pass through to a variable-gain operational amplifier 43. The output of the amplifier is monitored by a negative peak rectifier diode 45. The output of the negative peak rectifier diode forms one input for a comparator operational amplifier 47. A reference 49 forms another input to the comparator operational amplifier. The output of the comparator operational amplifier passes through a low passband filter 51 and forms an error voltage that permutes the gain of operational amplifier 43. The outputs of the monitored variable-gain amplifiers 29 and 43 form the inputs for combining operational amplifier 39 that processes the signal to form an output used to modulate an RF carrier to its maximum potential regardless of the input waveform asymmetry.

DESCRIPTION OF THE PREFERRED EMBODIMENT

Figure 2:
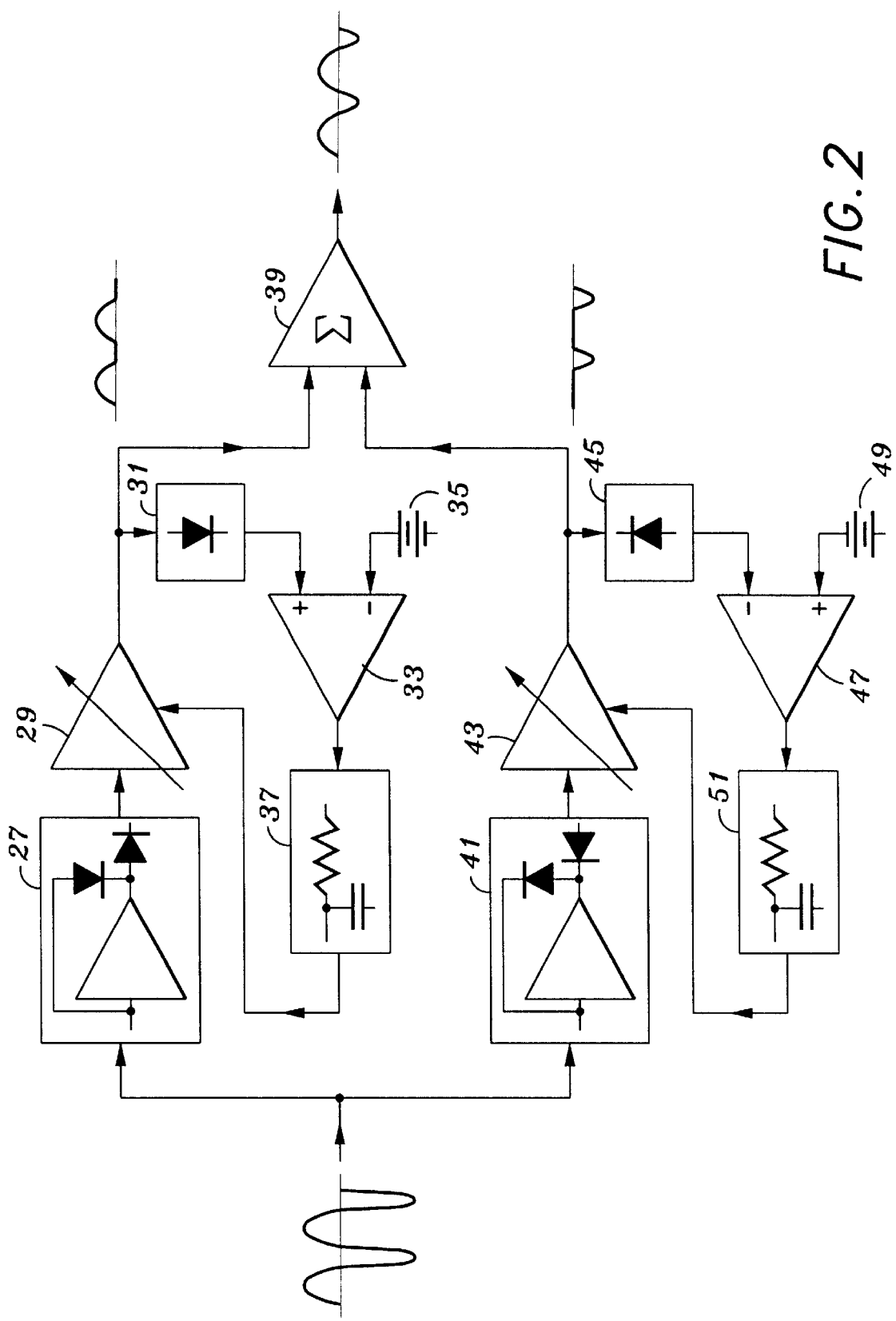
FIG. 2 shows a schematic of the presently preferred embodiment in which the positively sensed signal splitter 27 comprises an operational amplifier including suitably placed diodes that allow only positive components of the input signal to pass through to a variable-gain operational amplifier 29. The output of the amplifier is monitored by a positive peak rectifier diode 31. The output of the positive peak rectifier diode forms one input for a comparator operational amplifier 33. A reference 35 forms another input to the comparator operational amplifier. The output of the comparator operational amplifier passes through a low passband filter 37 and forms an error voltage that permutes the gain of operational amplifier 29.

The presently preferred embodiment comprises a polarity-independent transmission system that splits a generally asymmetric incoming signal as seen in FIG. 2 into positive and negative components. The positively sensed signal splitter 27 comprises an operational amplifier including suitably placed diodes that allow only positive components of the input signal, referenced to the incoming signal baseline, to pass through to the first input of a variable-gain operational amplifier 29. The positively sensed output of the amplifier is connected to and monitored by a positive peak rectifier diode 31. The output of the positive peak rectifier diode is connected to the first input of a comparator amplifier 33. A direct current reference bias 35 is connected to the second input of the comparison amplifier. The output of the comparison operational amplifier then passes through a low passband filter 37. Collectively, the positive peak rectifier diode, comparator amplifier, direct current reference bias and the output of the low passband filter, which is connected to the second input of the positively sensed variable-gain amplifier, comprise means for assigning a gain factor to the positive waveform excursions passing through the operational amplifier 29. A view of a typical positive sensed output signal, referenced to the input signal baseline, may be seen in FIG. 2, adjacent to the positively sensed variable-gain amplifier.

The negatively sensed signal splitter 41 comprises an operational amplifier including suitably placed diodes that concurrently allows only negative components of the input signal, referenced to the incoming signal baseline, to pass through to the first input of a variable-gain operational amplifier 43. The negatively sensed output of the amplifier is connected to and monitored by a negative peak rectifier diode 45. The output of the negative peak rectifier diode is connected to the first input of a comparator amplifier 47. A direct current reference bias 49 is connected to the second input to the comparison amplifier. The output of the comparison operational amplifier then passes through a low passband filter 51. Collectively, the negative peak rectifier diode, comparator amplifier, direct current reference bias and the output of the low passband filter, which is connected to the second input of the negatively sensed variable-gain amplifier, comprise means for assigning a gain factor to the negative waveform excursions passing through the operational amplifier 43. A view of a typical negatively sensed output signal, referenced to the input signal baseline, may be seen in FIG. 2, adjacent to the negatively sensed variable-gain amplifier.

The output of the positively sensed variable-gain amplifier is connected to one input of a combining operational amplifier 39. The output of the negatively sensed variable-gain amplifier is connected to another input of the combining amplifier. Since both input waveforms are referenced to the baseline of the input asymmetrical waveform, the output of the combining amplifier consists of an amplitude symmetric positive and negative waveform with a common baseline.

In use, the reference inputs to the two comparison amplifiers are adjusted so that the peak amplitudes of the positive and negative waveforms at the output of the combining amplifier comprise a signal that will provide one hundred percent modulation capability to a radio frequency carrier.

An alternative embodiment of the present invention utilizes digital implementation to process an audio input signal. To convert the audio input signal to a digital data stream, the signal is first sampled at a fixed rate. The sampling rate must be at least twice the highest audio frequency that is to be converted. The result of the sampling is a continuum of discrete, instantaneous values for the audio signal.

Each signal sample is quantized; that is, it is assigned a specific numerical value corresponding to its amplitude at the instant of sampling. In general, digital broadcast-quality audio systems have 16-bit resolution. This implies that the system has $2^{16}$ or 65,535 quantization levels. For a linear coding scheme, there will be 32,767 discrete values above the input resting signal baseline address of 32,768, and 32,767 discrete values below it. Referring to FIG. 1, the variable-gain amplifiers 3 and 17 now function as arithmetic multiplication operators for numerical values above and below the input signal baseline, respectively.

The output streams of the multiplication operators are monitored to determine the peak values of the positive and negative incoming audio signal. This information is then used to assign an independent multiplication factor for all numbers above 32,768, and another multiplication factor for numbers below 32,768. These multiplication factors are time varying and constantly updated by a controlling software routine. To impart gain, a sample would be multiplied by a number greater than one. To attenuate the signal, the sample would be multiplied by a decimal fraction less than one. These ongoing, continuous computations are programmed as feedback to the two multiplication operators and thus maintain audio output level peaks at the ±32,767 system limits. The output streams are then combined and used to modulate a radio frequency carrier to its maximum potential, regardless of input signal waveform asymmetry.

Conventional audio processors employ either limiting techniques whereby the output signal is restricted to a maximum instantaneous value, or compression techniques that reduces the dynamic range of the average value of the program. Both processors necessarily generate asymmetric signal outputs that cannot achieve one hundred percent radio frequency modulation without adding distortion.

By splitting the input signal into positive and negative components and then operating on the separate components as described above, it can be seen that the present invention will modulate a radio frequency carrier to its maximum potential regardless of input waveform asymmetry.

Although the description above contains many specifications, these should not be construed as limiting the scope of the invention, but as merely providing illustrations of some of the presently preferred embodiments of the invention.

What is claimed is:

1.) A method for effecting a polarity-independent transmission system comprising:

splitting a generally asymmetric incoming audio signal into positive and negative components;

passing the positive component through a variable-gain amplifier to produce a positively sensed output signal;

monitoring the output of the variable-gain amplifier;

comparing the output of the variable-gain amplifier to a direct current reference bias;

assigning a gain factor to the variable-gain amplifier that is predicated on the magnitude of the direct current reference, while concurrently passing the negative component of the incoming signal through a variable-gain amplifier to produce a negatively sensed output signal;

monitoring the output of the variable-gain amplifier;

comparing the output of the variable-gain amplifier to a direct current reference bias;

assigning a gain factor to the variable-gain amplifier that is predicated on the magnitude of the direct current reference;

inputting the positively and negatively sensed output signals to a combining amplifier in order to produce a positive and negatively sensed output signal;

adjusting each direct current reference so that the peak amplitudes of the positive and negative signals at the output of the combining amplifier comprise a signal that will provide one hundred percent modulation capability to a radio frequency carrier.

2.) A polarity-independent transmission system comprising:

a positively sensed signal splitter having an input and an output, the input of the positively sensed signal splitter connected to an incoming signal;

a positively sensed variable-gain amplifier having a first and second input and an output, the first input of the variable-gain amplifier connected to the output of the positively sensed signal splitter;

a positive peak rectifier diode having an input and an output, the input of the diode connected to the output of the positively sensed variable-gain amplifier;

a comparison amplifier having first and second inputs and an output, the first input connected to the output of the positive peak rectifier diode;

a direct current reference bias having an output connected to the second input of the comparison amplifier;

a low bandpass filter having an input and an output, the input connected to the output of the comparison amplifier and the output connected to the second input of the variable-gain amplifier;

a negatively sensed signal splitter having an input and an output, the input of the positively sensed signal splitter connected to the incoming signal;

a variable-gain amplifier having a first and second input and an output, the first input of the variable-gain amplifier connected to the output of the negatively sensed signal splitter;

a negative peak rectifier diode having an input and an output, the input of the diode connected to the output of the negatively sensed variable-gain amplifier;

a comparison amplifier having first and second inputs and one output, the first input connected to the output of the negative peak rectifier diode;

a direct current reference bias having an output connected to the second input of the comparison amplifier;

a low bandpass filter having an input and an output, the input connected to the output of the comparison amplifier and the output connected to the second input of the variable-gain amplifier;

a combining amplifier having a first and second input and an output, the first input connected to the output of the positively sensed variable-gain amplifier and the second input connected to the output of the negatively sensed variable-gain amplifier whereby the output of the combining amplifier comprises a symmetrical signal suitable for modulating a radio frequency carrier.

3.) A method for effecting a polarity-independent transmission system comprising:

splitting a generally asymmetric incoming audio signal into positive and negative components;

sampling the positive component of the incoming signal;

assigning a specific numerical value to the positive component of the incoming audio signal corresponding to its amplitude at the instant of sampling;

passing the positive component through an arithmetic multiplication amplifier to produce a positively sensed output stream;

monitoring the output stream to determine the positive peak value of the incoming audio signal;

assigning an independent multiplication factor;

programming the multiplication factor as feedback to the arithmetic multiplication amplifier;

sampling the negative component of the incoming signal;

assigning a specific numerical value to the negative component of the incoming audio signal corresponding to its amplitude at the instant of sampling;

passing the negative component through an arithmetic multiplication amplifier to produce a negatively sensed output stream;

monitoring the output stream to determine the negative peak value of the incoming audio signal;

assigning an independent multiplication factor;

programming the multiplication factor as feedback to the arithmetic multiplication amplifier;

combining the positively and negatively sensed output streams.

* * * * *